(12) United States Patent
Robbins

(10) Patent No.: US 7,264,179 B2
(45) Date of Patent: Sep. 4, 2007

(54) METHOD AND APPARATUS FOR MEMS DEVICE NEBULIZER LUBRICATION SYSTEM

(75) Inventor: Roger A. Robbins, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 334 days.

(21) Appl. No.: 11/096,479

(22) Filed: Apr. 1, 2005

(65) Prior Publication Data
US 2005/0178848 A1  Aug. 18, 2005

Related U.S. Application Data

(62) Division of application No. 10/331,319, filed on Dec. 30, 2002, now Pat. No. 6,921,680.

(60) Provisional application No. 60/345,716, filed on Dec. 31, 2001.

(51) Int. Cl.
*A62C 31/00* (2006.01)
*F23D 11/16* (2006.01)
*B05B 7/06* (2006.01)
*A61M 11/02* (2006.01)

(52) U.S. Cl. .............. 239/398; 239/419; 239/427; 239/427.3; 239/434; 239/434.5; 239/366

(58) Field of Classification Search .............. 239/398, 239/419, 427, 427.3, 434, 434.5, 366–369; 438/48, 50
See application file for complete search history.

(56) References Cited

U.S. PATENT DOCUMENTS

| | | | |
|---|---|---|---|
| 5,331,454 A | | 7/1994 | Hornbeck |
| 6,045,056 A | * | 4/2000 | Tardoni .................. 239/8 |
| 6,221,435 B1 | * | 4/2001 | Nielsen .................. 427/421.1 |
| 6,300,294 B1 | | 10/2001 | Robbins et al. |
| 6,475,570 B2 | | 11/2002 | Jacobs |
| 6,806,993 B1 | | 10/2004 | Adams et al. |

* cited by examiner

*Primary Examiner*—Davis Hwu
(74) *Attorney, Agent, or Firm*—Charles A. Brill; Wade James Brady, III; Frederick J. Telecky, Jr.

(57) ABSTRACT

A nebulization system, which creates a uniform fog of tiny suspended liquid droplets, to lubricate the surfaces of MEMS devices. These droplets fall over the edge of a baffle and are then mixed with an umbrella-like sheet of $N_2$ turbulation gas to generate a uniform cloud of droplets that fill a passivation chamber. The MEMS device is then positioned in this uniform cloud of lubricant droplets for a specified amount of time, thereby uniformly lubricating all the surfaces of the device. The system uses a laser monitoring approach to control the uniformity of the lubricant cloud by providing feedback to the system to control the flow of gases. The system also equalizes the pressure around the sample device seal to prevent gases from entering or exiting the chamber and thereby influencing the environment inside the chamber.

9 Claims, 8 Drawing Sheets

US 7,264,179 B2

METHOD AND APPARATUS FOR MEMS DEVICE NEBULIZER LUBRICATION SYSTEM

This application is a Divisional of application Ser. No. 10/331,319, filed Dec. 30, 2002, now U.S. Pat. No. 6,921,680 and Provisional Application No. 60/345,716, filed Dec. 31, 2001.

FIELD OF THE INVENTION

The present invention relates to the passivation of MEMS devices and more particularly to a method and apparatus for uniformly applying the lubricant to these devices.

BACKGROUND OF THE INVENTION

Micro-machined or micro-electro-mechanical systems (MEMS) devices, where there is repeated physical contact between moving parts, require lubrication to prevent the onset of stiction (static friction). This stiction can be strong enough to cause the parts to stick together irreversibly, making the devices inoperable.

For example, in the digital micromirror device (DMD™) of FIG. 1, which is a type of MEMS device, a potential difference between yoke address electrodes 107 and the yoke 101 (and between mirror address electrodes 108 and the mirror 100) cause the mirror/yoke assemblies 100/101 to rotate on torsion hinges 102 attached to support posts 103 until the yoke tips 104 contact landing pads 105 located on a lower layer of the device on top of the substrate 106. It is this mechanical contact between the yoke landing tips and the landing pad sites that is of particular relevance to this invention. In some cases the mirror/yoke assemblies become slow in lifting off the landing pad, affecting the response of the device and in other cases the assemblies become permanently stuck to the landing pads. One of the primary causes of stiction has been shown to be that of the landing tips scrubbing into the metal landing pads.

By passivating (lubricating) the contact surfaces of the MEMS devices to make them "slick," this sticking problem can be essentially eliminated over long operating times. However, a problem has been that of uniformly applying the lubricant to the device, thereby resulting in a considerable reduction in the lifetime of the devices. Also, the cost of applying the passivant can considerably impact the final device cost. What is needed is an effective passivation method that exposes the MEMS device to a mist of tiny lubricant droplets, which are deposited uniformly over the device. The method and apparatus of the present invention meets this need.

SUMMARY OF THE INVENTION

The present invention utilizes nebulization, which creates a fog of tiny suspended liquid droplets, to lubricate the surfaces of MEMS devices and help prevent any moving parts of the devices from binding or sticking. A uniform density of these fog droplets is critical for proper passivation of the MEMS devices in order to provide long life parts.

In the method of the present invention, the droplets fall over the edge of a convex baffle and are then mixed with an umbrella-like sheet of $N_2$ turbulation gas, being forced out from the underneath concave side of the baffle, to generate a uniform cloud of droplets that fill the passivation chamber. The MEMS device is then positioned in this uniform cloud of oil droplets for a specified amount of time, thereby uniformly lubricating the surface of the device.

The nebulization system of the present invention uses a laser/receiver system to monitor and control the mist density in the deposition chamber to assure a uniform passivation of the MEMS device surface. In addition, the system utilizes a slide mechanism to quickly insert and extract the MEMS devices into the nebulization cloud without disturbing the uniformity of the cloud or its deposition rate. This slide mechanism positions the device in the system base plate aperture for exposure to the cloud of droplets. A seal exists around the slide mechanism and the pressure is equalized between the inside and outside of the deposition chamber to minimize any possible gas exchange between the deposition chamber and the outside environment that could impact the uniformity of the droplets.

By controlling the passivation process using the method of the present invention, long lifetime MEMS devices can be fabricated at a reasonable cost.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The present invention discloses a nebulization system, which creates a uniform fog of tiny suspended liquid droplets, to lubricate the surfaces of MEMS devices to help prevent any moving parts of the devices from binding or sticking.

Figure 2:
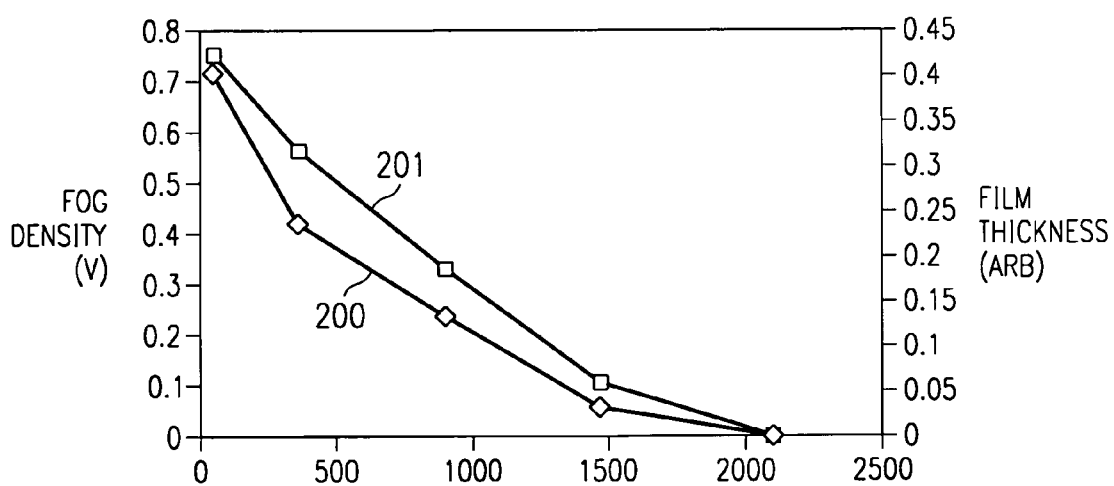
FIG. 2 are curves showing the fog density and deposited film thickness over time in a static nebulizer chamber where the flow of the lubricant is turned OFF.
Figure 3:
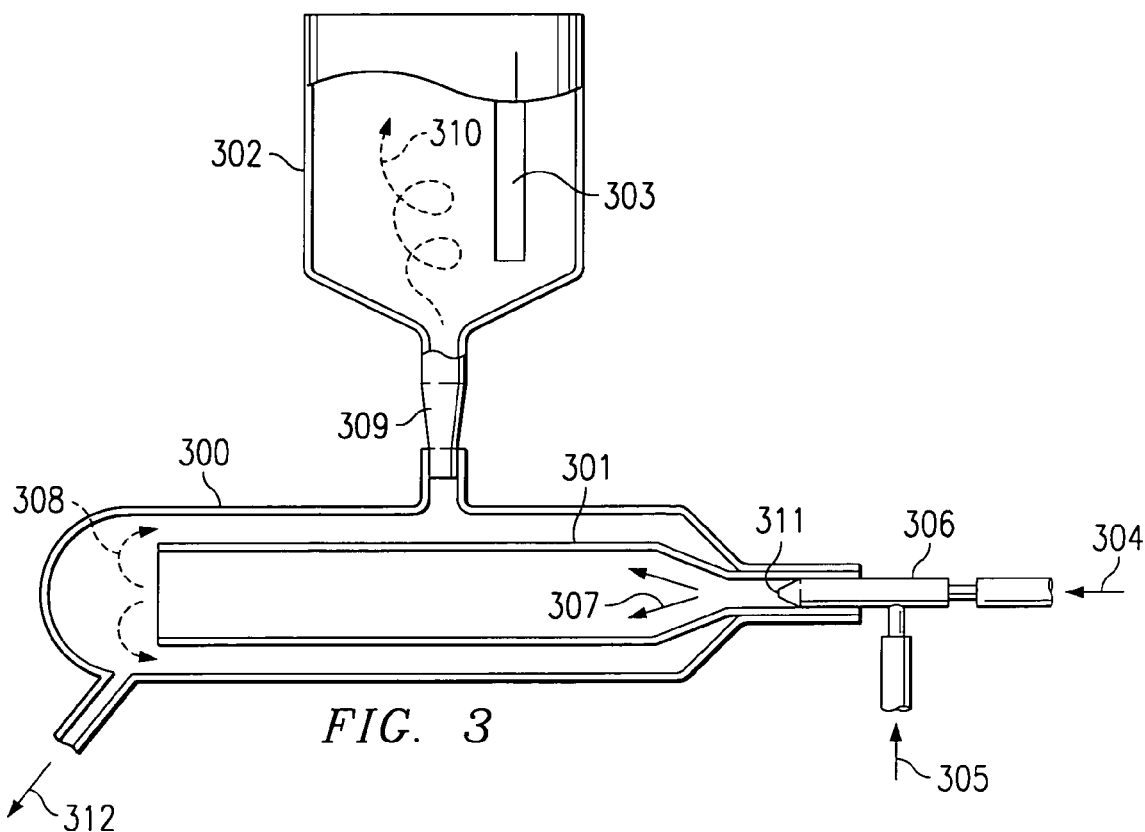
FIG. 3 is a drawing of the concept nebulizer system of the present invention.
Figure 4B:
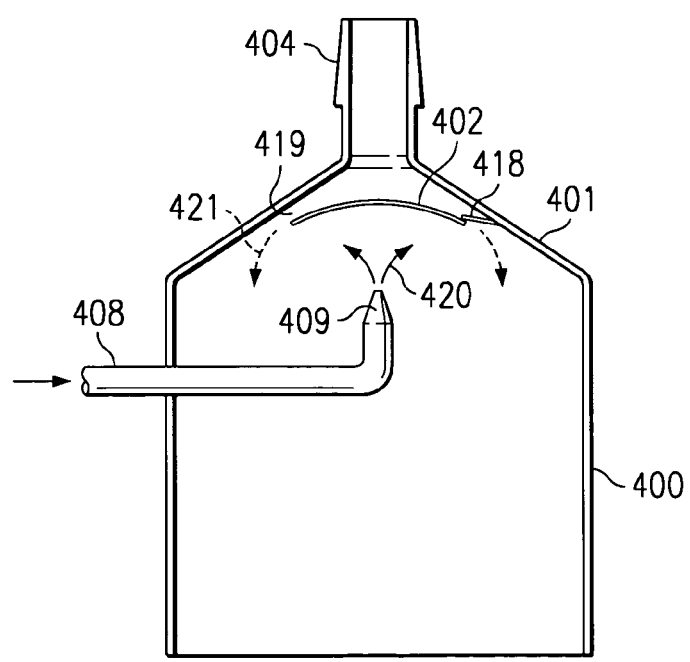
FIG. 4b is a drawing showing an exploded view of the nebulizer's passivation chamber, including the turbulation baffle and $N_2$ turbulation gas nozzle used to create a uniform cloud of lubricant droplets inside the containment chamber.
Figure 4A:
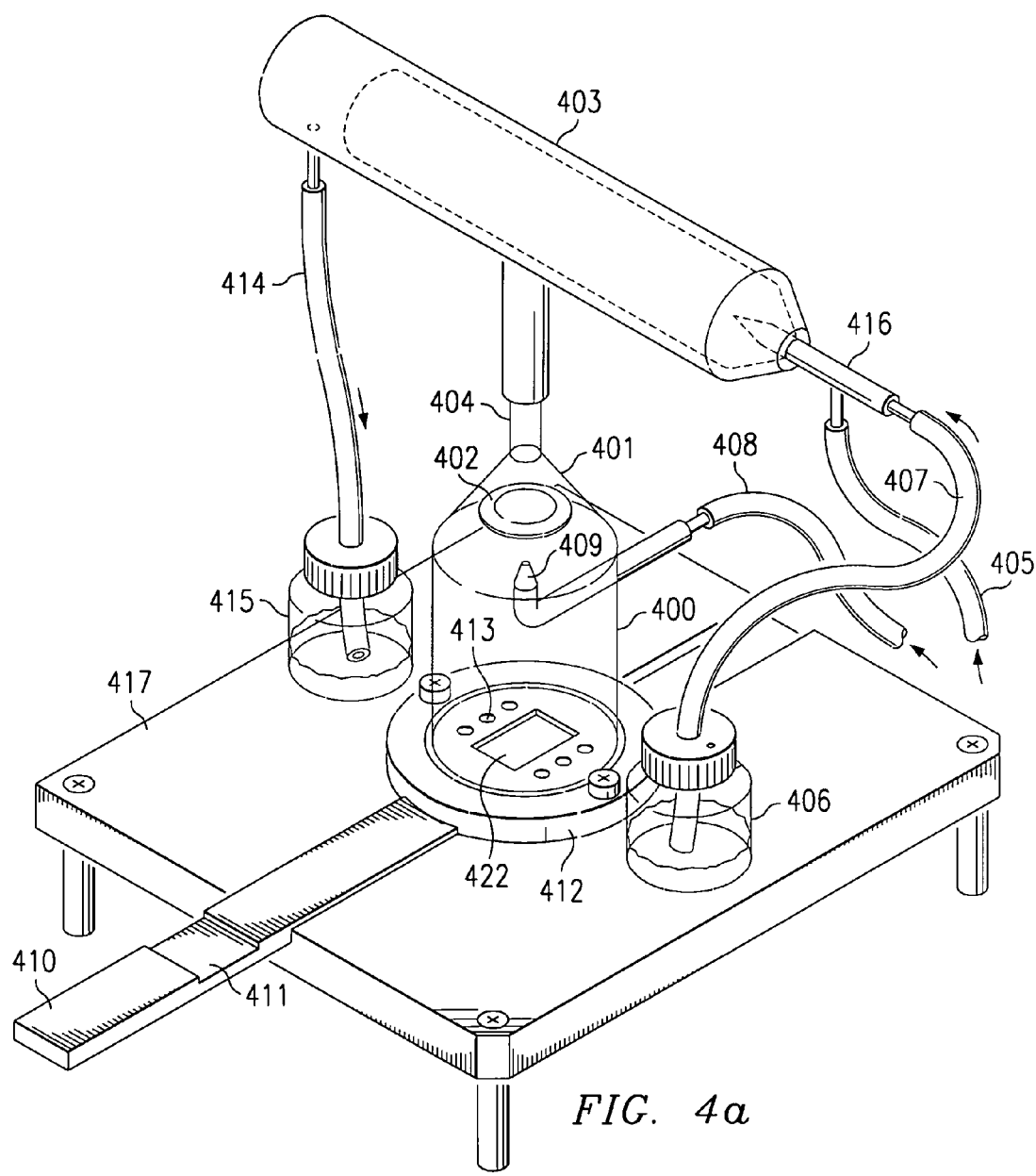
FIG. 4a is a drawing of the preferred embodiment for the nebulizer system of the present invention.
Figure 5:
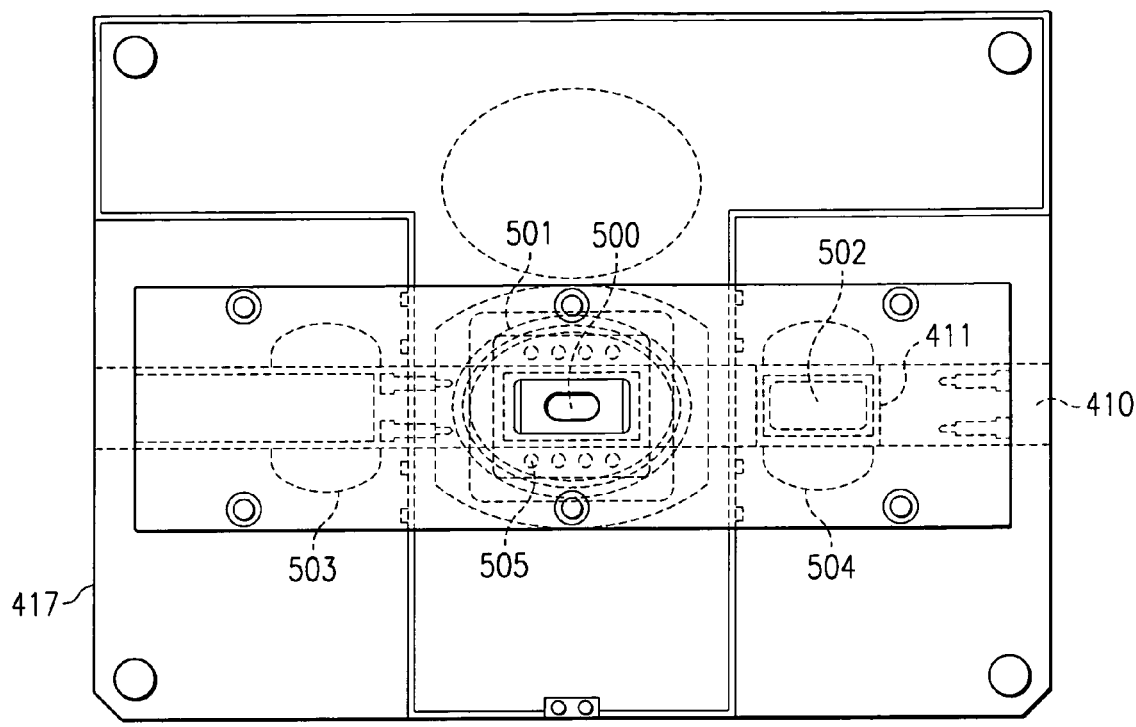
FIG. 5 is a drawing illustrating the device sample slide mechanism, which is used to insert and extract MEMS devices into the nebulizer system for passivation without disturbing the uniform cloud of lubricant inside the passivation chamber.

FIG. 2 shows the results of an experiment performed to determine how the aerosol fog density 200 and thus the deposition rate drop-off with time after charging a chamber with a lubricant and then sealing the chamber. Curve 201 represents the oil film thickness as measured on the surface of a specimen. The results of this experiment indicate that a constant, well controlled, flow of lubricant is required for proper passivation of a MEMS device.

FIG. 3 is a schematic drawing for the concept nebulizer system of the present invention. The system consist of a lubricant aerosol mixing chamber 300 and a specimen (device) deposition chamber 302 attached to the mixing chamber 300 by means of a neck tube 309. The lubricant 304 is applied to the straight input of a Meinhardt Nebulizer 306 attached to one end of the mixing chamber 300 and $N_2$ nebulizer gas 305 is attached to a second right angle input of the nebulizer. The gas/lubricant mixture 307 exits the nebulizer through a nozzle 311, creating a cloud of the lubricant inside an inner wall 301 of the chamber in which large droplets fall out of the gas stream. The fine mist then flows 308 around the end of the inner wall and fills the entire mixing chamber 300. Lubricant condensate is drained out of the mixing chamber through a drain tube 312. A MEMS device is placed in a positioning slot 303 located in the side of the open top passivation chamber 302. The lubricant cloud 310 then enters the deposition chamber 302 through tube 309, filling the chamber, and depositing a film of the lubricant on the specimen.

As shown from the results of the experiment discussed earlier, it is critical that the nebulizer system be maintained in a homogeneous cloud of the lubricant around the device specimen. This requires that there be no flow of air or lubricant between the outside atmosphere and the passivation chamber. However, the open top of the passivation chamber 302 and the open slot in the side of the chamber 303 of this concept embodiment of the invention allows some mist-density swirling to exist in the chamber, which then creates an undesirable non-uniform deposition rate.

FIG. 4*a* is a drawing of the preferred embodiment for the nebulizer system of the present invention, which addresses this uniformity problem. This system maintains atmospheric pressure around the seal where the MEMS device is inserted, to prevent inward or outward flow of any gases. The system is built-up on a base plate 417 that can accommodate a closed hood over the entire apparatus to help control the environment around the seal. The passivation chamber, where the specimen is exposed to a cloud of passivant, consists of a cylinder 400 that is attached at the bottom surface to the base plate 417 by a set of o-rings 412 and has an inverted funnel like top 401. FIG. 4*b* shows an expanded view of the passivation chamber. The neck 404 of the funnel 401 is attached to a drift tube 403. A baffle 402 having a spherical surface is attached to the wall of the funnel 401 just below the neck of the funnel at three points 418, thereby leaving a small gap 419 between the baffle and the wall of the funnel with the exception of the three attachment points. The drift tube is sloped downward from input to output relative to the base plate 417. The Meinhardt nebulizer 416 extends from the input of the drift tube with lubricant from a reservoir 406 supplied to the straight input by tubing 407. A supply of $N_2$ carrier gas is supplied to the right angle input 416 through tubing 405. The lubricant and $N_2$ gas are mixed, forming small droplets of the lubricant that drift down the drift tube 403 and down the neck 404 of the funnel on to the spherical surface of the baffle 402. Large droplet lubricant condensate from the drift tube drains out of an exit port 414 at the lowest point on the drift tube 403 and is collected in a condensate reservoir 415. A second supply of $N_2$ gas 408 is supplied through the wall of the passivation chamber 400 and out through a right angle nozzle 409. $N_2$ turbulation gas 420 exiting the turbulation nozzle 409, strikes the underneath concave surface of the baffle 402, and is forced outward toward the gap 419 in an umbrella like fashion where the droplets of lubricant are entering the chamber 400. As the lubricant mist flows around the convex spherical surface of the baffle 402, the $N_2$ turbulation gas creates a homogeneous cloud of lubricant 421 that fills the passivation chamber 400. This satisfies the first critical requirement of providing a homogeneous cloud of lubricant for passivating the surfaces of MEMS devices.

The second critical requirement is a method of loading the MEMS device into the chamber without disturbing the environment inside the chamber and affecting the homogeneity of the lubricant, which can affect the uniformity of the passivation of the MEMS device. This requires that no air enter the passivation chamber, creating undesirable mist density variations, and that no oil droplets exit the chamber around the mechanism used to load the device. This requirement is accomplished by means of a slide 410, which holds the device to be passivated, built into the base plate 417. The specimen is placed in the device slot 411 and the slide is moved in a slot to place the device in an exposure aperture 422 located in the center of the passivation chamber 400. The environment inside and outside the passivation chamber and around the slide seal is maintained at a constant pressure via an active exhaust system, so that there is no exchange of gases or droplets across the slide seal. Passivation chamber exhaust holes 413 are included for use in maintaining this constant pressure between the inside and outside of the chamber. The active exhaust system consists of a throttled, remote vacuum pump whose gas throughput is set to maintain atmospheric pressure in the nebulization chamber 401.

In operation, mist from the drift tube falls into the neck 404 of the funnel portion 401 of the passivation chamber and splits around the convex surface of the spherical baffle 402. $N_2$ gas flow from the right angle turbulation jet 409 impacts the concave surface of the baffle 402 and swirls away from it in rapid eddies, which expands the mist entering the gap 419 around the edge of the baffle 402, into the full diameter of the passivation chamber 400. The eddy motion subsides by the time the mist cloud moves to approximately ¾ the length of the large diameter chamber tube 400. Thus, at the specimen location, the mist particle motion has subsided to a minimal velocity, allowing some of the lubricant droplets to settle out on the surface of the device. The turbulation jet can also be used to control the deposition rate, where in general the more turbulation gas flow, the lighter the deposition rate.

FIG. 5 shows some of the details of the slide mechanism in the preferred embodiment of the invention, used for inserting and extracting devices into the passivation chamber. This slide mechanism 410 allows for quick exchange of devices, thus providing high throughput processing capability. The figure shows one device 500, loaded in a first device slot in the slide mechanism 410 and positioned within the aperture 501 of the passivation chamber, while a second device 502 is being loaded into a second device slot 411 of the slide mechanism 410. In operation, the slide mechanism 410 is moved to the left placing device 502 in the passivation aperture 501 and allowing the passivated device 500 to be removed from the opening 503 on the left side of the assembly and a new device to be loaded. The mechanism is then moved back and forth, from right to left and then left to right, with the previous device being removed and a new device being loaded while the present device is being passivated. The slide carrier 410 has finger cutouts 504 on each side of the device nest so that the device can be quickly loaded into the nest. The nest is made just deep enough for the top of the device to pass under a mist flange with a very small gap to minimize any mist from escaping the system. The top of the slide 410 is made planar so that when the slide is moved in and out of the passivation chamber there will be no disturbance of the mist cloud in the chamber. Exhaust holes 505 are included for use in maintaining an equal pressure inside and outside the chamber. Thus, the steady state condition of the mist cloud is maintained when exchanging device samples; thereby satisfying the second critical requirement of the system of enabling a constant mist cloud with no settling or recovery time when the device is ready for passivation.

Figure 6A:
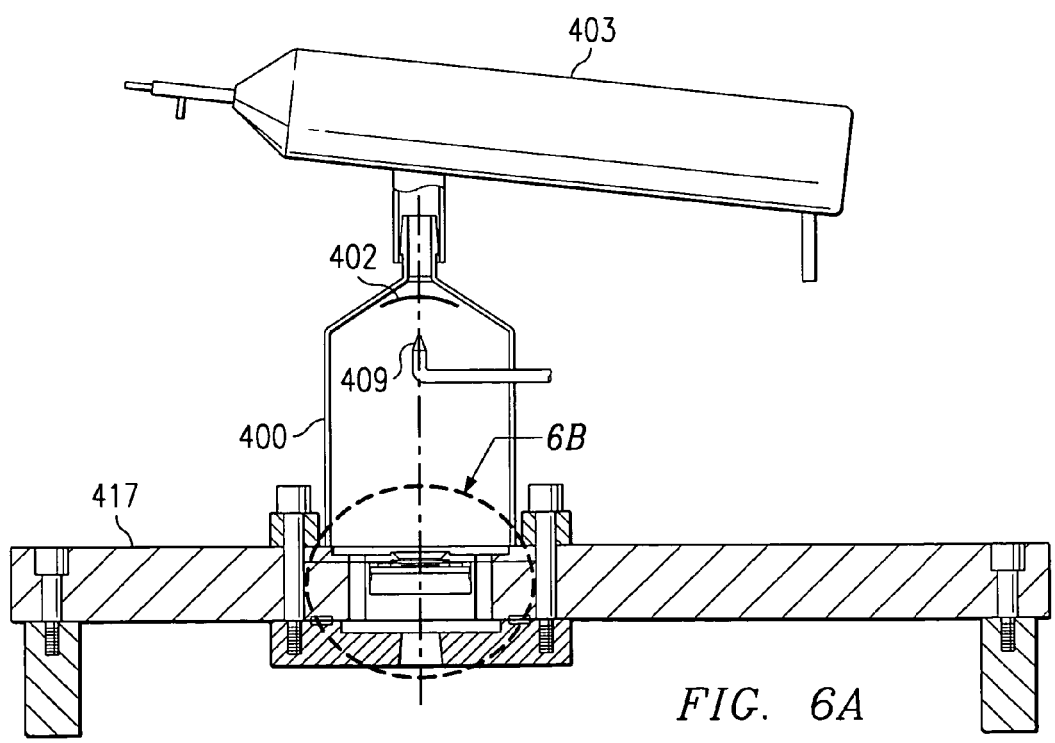
FIG. 6 is an exploded view of the slide mechanism of FIG. 5, which illustrates how the gas exits the chamber and how the gap around the device is sealed off.
Figure 6B:
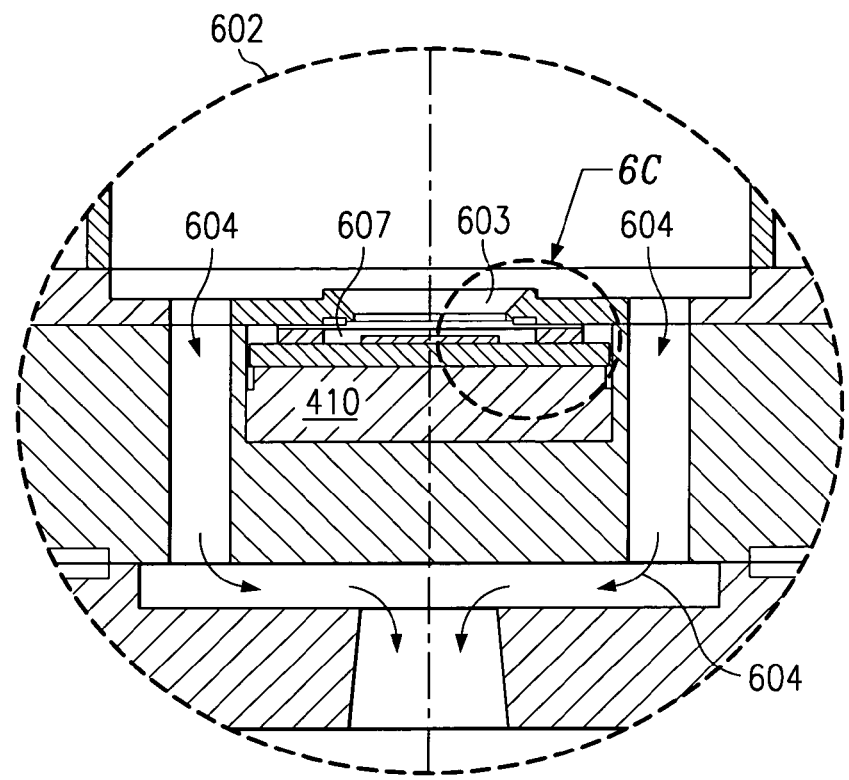
Figure 6C:
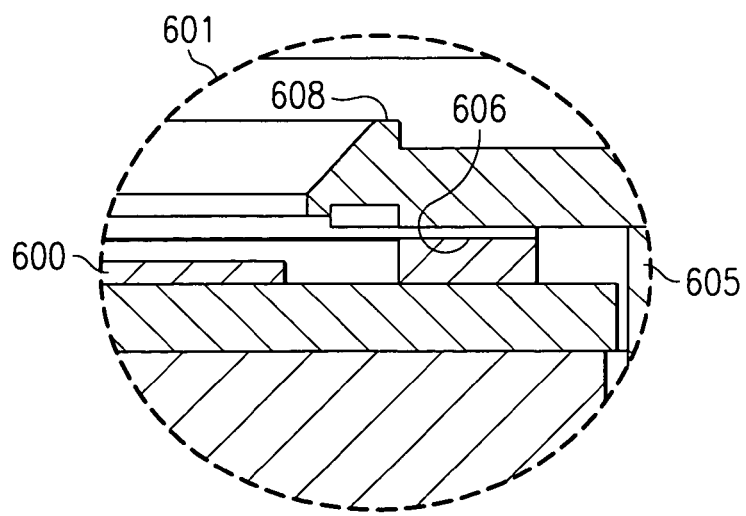

FIG. 6 shows an exploded view 602 of the slide mechanism 410 and the aperture 603 in the preferred embodiment of the present invention, illustrating how the gap around the MEMS device package 601 is sealed off. This shows the exhaust paths 604 used in maintaining equal pressure inside and outside the passivation chamber 400. Since the MEMS device 600 is attached to a package 601, which later must have an optical window attached to it, care must be taken to keep the lubricant off the window seal surface 606 of the package. Therefore, as illustrated in the further expanded view 605, the passivation aperture 603 is sealed off from the window seal area 606 of the device package, keeping this portion of the package virtually free from any oil films. This approach allows the lubricant to be deposited only on the surfaces of the MEMS device. The chamber diameter is made large relative to the aperture to allow a large acceptance angle of the deposition cloud to the device. However, the aperture walls are made quite steep to prevent excessive buildup of the lubricant on them.

To help prevent mist condensate from wetting the bottom of the aperture shield and then wiping across the package window seal area when the device is moved into and out of the aperture, a groove 607 is milled under the sloping aperture. Also, a liquid condensate dike 608 is added to help prevent any buildup of condensate from dripping into the package cavity. However, as the package is inserted into the aperture, the leading edge of the window seal will possibly be exposed to a small amount of lubricant. However, since the passivation time is on the order of 30 seconds and the leading edge seal exposure time to the lubricant is less than 0.1 seconds, any deposition of lubricant on the seal is determined to be less than 1/150 of a monolayer, which is negligible and has not shown to present any problem to the window seal process.

The passivant mist must be carefully attended to so that the deposition process will be uniform, repeatable, and safe. The gas flow concept requires that the mist cloud be homogeneous in the deposition chamber area around the device specimen and that the deposition rate be controllable and repeatable. To assure that these condition are met, an exhaust pump is used to control the exhaust flow, so that in the system the turbulation gas flow plus the nebulizing gas carrier flow is kept equal to the exhaust flow, thereby preventing any mist from leaking out of the system around the seal or any air from leaking into the system, either of which could disturb the steady state dynamics in the mist.

Figure 7:
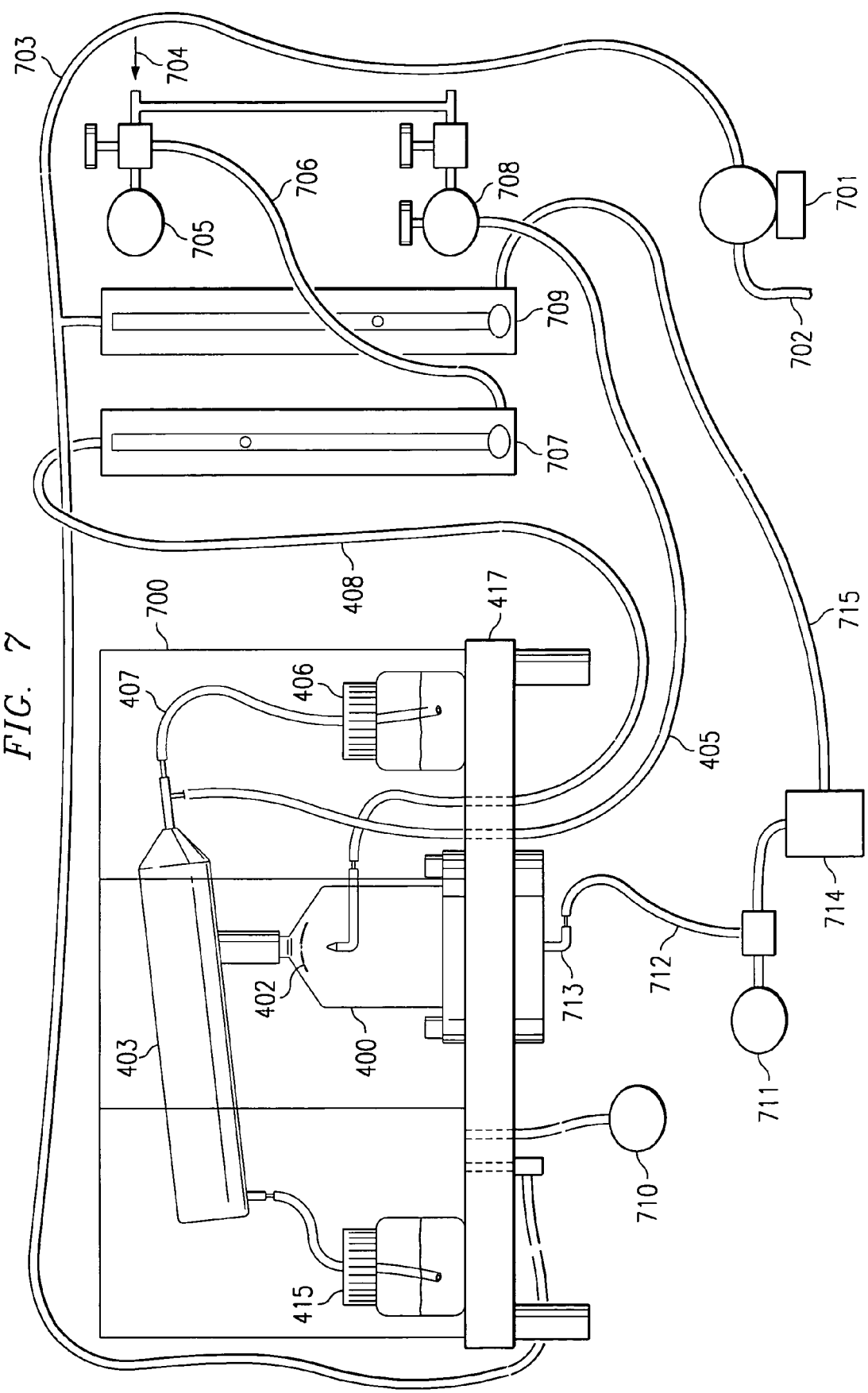
FIG. 7 is a plumbing diagram for the nebulizer system of the preferred embodiment of the present invention.
Figure 8:
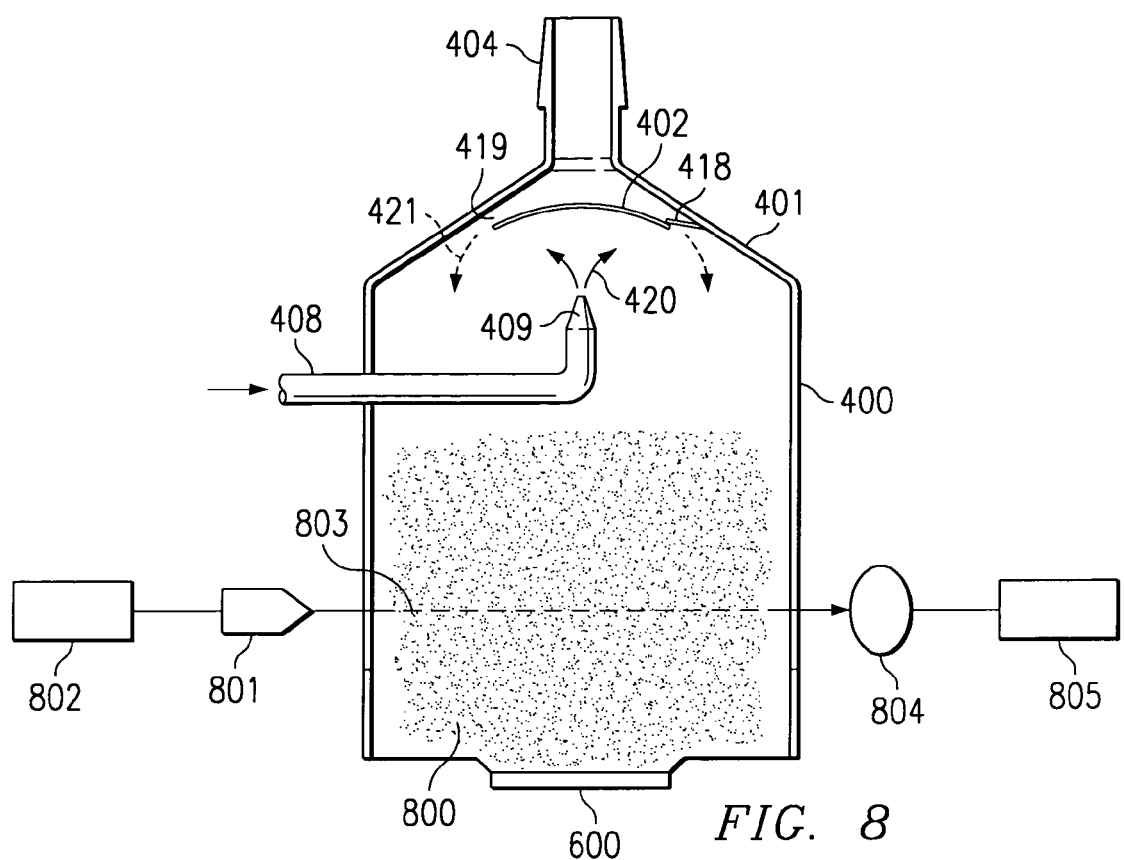
FIG. 8 is a drawing of the passivation chamber of the present invention illustrating the use of a laser/receiver to monitor and provide feedback control to maintain uniformity in the cloud of lubricant droplets inside the chamber.
Figure 9:
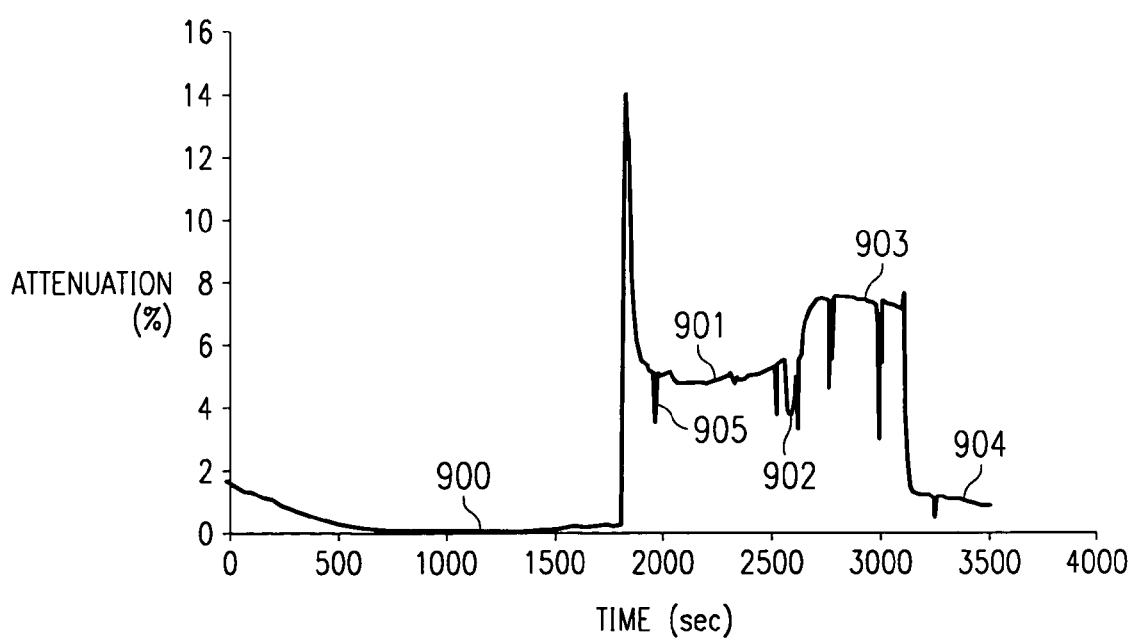
FIG. 9 is a plot showing the nebulizer mist density as measured by the laser monitoring system in the preferred embodiment of the present invention.
Figure 10:
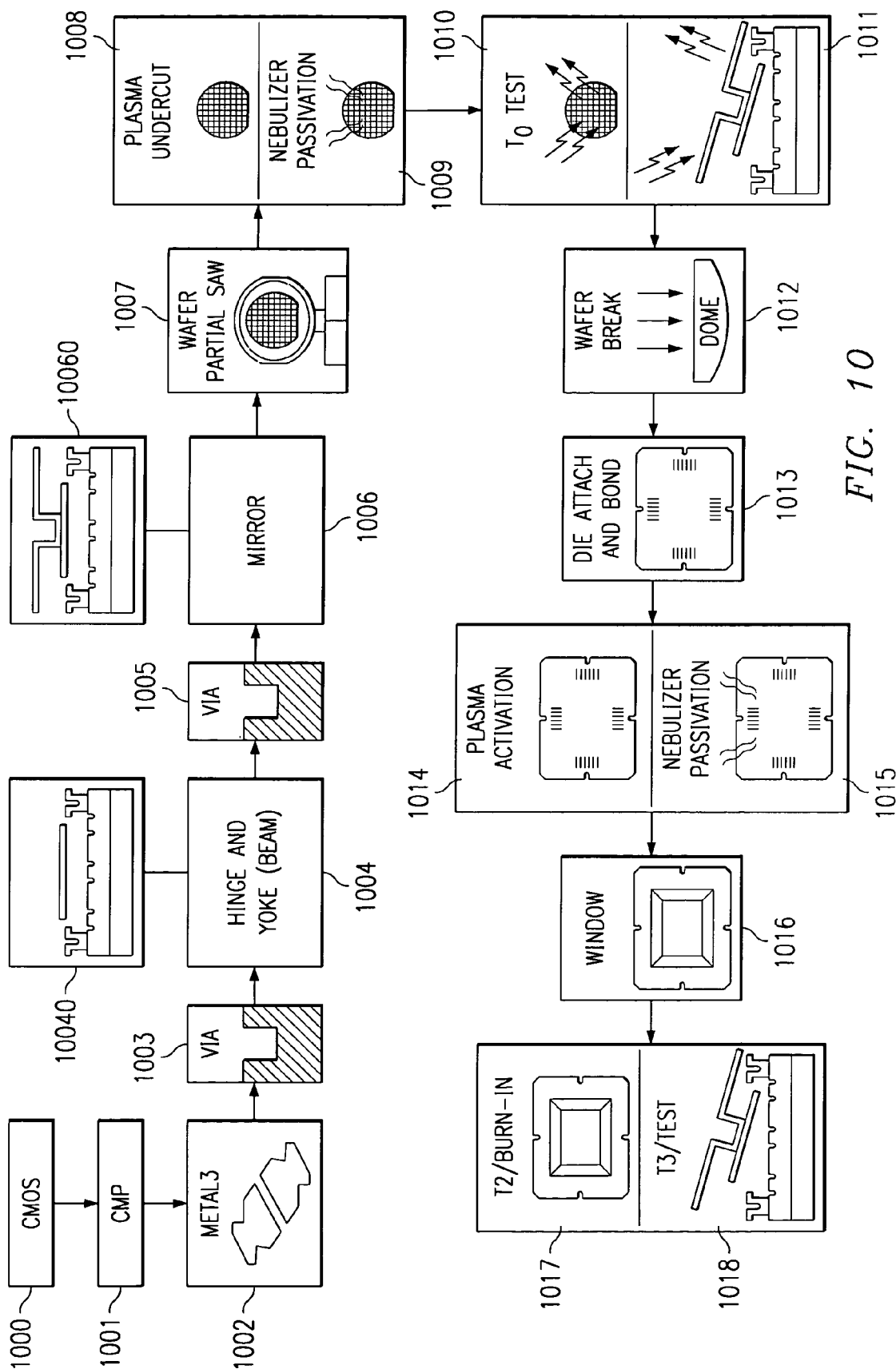
FIG. 10 is a process flow diagram for fabricating a DMD MEMS device, which includes the nebulizer lubrication method of the present invention.

The plumbing diagram for the preferred embodiment of the invention is shown in FIG. 7. This shows the system base plate 417 with the passivation chamber 400, including the spherical surface baffle 402, the drift tube 403, the lubricant supply reservoir 406, and the condensate oil reservoir 415 mounted to the base plate and enclosed inside a hood 700. Lubricant from the reservoir 406 is supplied to the straight input of the Meinhardt nebulizer by tubing 407. The environment inside the system hood, but outside the passivation chamber, is controlled by a vacuum pump 701, with exhaust 702, which is connected by means of a vacuum line 703. A vacuum gauge 710 is used to observe the hood volume pressure. $N_2$ gas 704 is supplied to both a turbulator pressure regulator 705 and to a nebulizer pressure regulator 708. Controllable nebulizer $N_2$ gas from the pressure regulator 708 is connected through the base plate to the Meinhardt nebulizer input of the drift tube 403 by tubing 405. Turbulator $N_2$ gas is supplied from regulator 705 to the input of a flow meter 707 by means of tubing 706. The output of flow meter 707 is connected through the base plate to the passivation chamber turbulator nozzle by means of tubing 408. The deposition chamber exhaust port 713 is connected to the input of an oil sieve 714 by tubing 712 and to a chamber pressure gauge 711. The output of the oil sieve 714 is connected to one side of an exhaust balance flow meter 709 by tubing 715 with the other side of the exhaust balance flow meter 709 being connected to the system vacuum pump 701.

Figure 1:
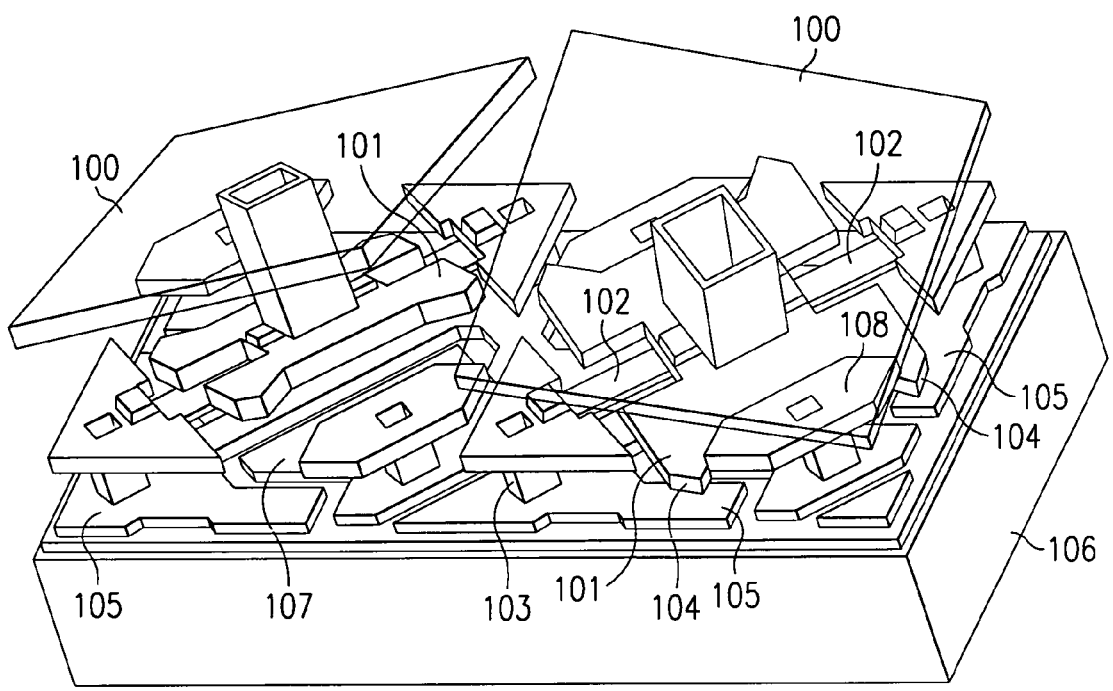
FIG. 1 is a drawing of a DMD™, one type of MEMS device, with moving parts that requires lubrication to prevent the parts from sticking and becoming inoperable.

As mentioned earlier, it is critical that the mist density uniformity be constant and repeatable. The system uses a mist density monitor and system feedback control as shown in the drawing of FIG. 8, to assure that the density remains within specification. The monitoring system consists of a red laser 801 and power supply 802, which passes a beam of light 803 through the walls of the passivation chamber and an optical receiver 804 located on the opposite side of the chamber. The laser beam passes through the mist cloud 800 inside the chamber 400, scattering the light and thereby attenuating the signal from the sensor. The monitoring system is calibrated with no mist in the chamber and then the mist signal is referenced to the calibration signal and used as an input to a mist density process controller 805. As the mist density increases, there is more scattering of the light beam by the mist droplets, causing the receiver 804 signal level to drop in voltage. The process controller 805 provides a feedback signal to control the parameters discussed in the plumbing diagram of FIG. 7 to control the mist density both over time and from run-to-run.

FIG. 9 is a graph of attenuation data showing the mist density monitor's response to different mist conditions. Signal 900, to the left of the graph, is the calibration signal with no mist in the chamber. The passivation chamber is then filled with mist droplets to give the typical attenuation signal 901. In this example, when the mist density is increased, causing more scattering of the light, then the attenuation increases (signal voltage decreases) as shown in signal 903. When the mist flow is stopped, the monitor signal returns to zero attenuation 904 as the mist dissipates in the chamber. The negative spikes 905 shown in this data are caused by flashlight observations during the test.

FIG. 10 is a process flow diagram for a DMD MEMS device, which includes the nebulizer passivation method of the present invention. The process starts with CMOS wafers 1000 with an array of monolithically fabricated SRAM address circuits (pixels) built-in. Although this SRAM address circuit uses conventional semiconductor processing techniques, there are significant differences due to the mechanical nature of the superstructure to be built on top of the SRAM, the need to lubricant all moving parts of the device being one critical difference. This CMOS circuit is basically an array of SRAM memory cells, which stores the binary state that causes each micro-mirror to tilt typically either +10° or −10°. A layer of thick oxide is deposited over the metal-2 layer of the CMOS array and then this isolation layer is planarized using chemical mechanical polishing (CMP) 1001 techniques. The superstructure (metal micro-mirror) process begins by depositing a metal-3 layer of Aluminum on top of the thick oxide substrate layer and then pattering and etching this Aluminum to form yoke address electrodes 107 and yoke landing pads 105, as shown in FIG. 1. Next, an organic sacrificial layer is spun onto the micro-planarized surface of the metal-3 layer and then lithographically patterned and hardened, leaving vias 1003 through this layer for the attachment of metal support posts.

Next, is the formation of the hinge and yoke 1004 (beam) structure, shown in exploded view 10040. First, a thin metal layer, which is ultimately the hinge material, is sputter-deposited on top of the sacrificial layer. Then a layer of $SiO_2$ is plasma-deposited over this thin metal layer and patterned in the shape of the hinges 102. This pattern serves as an etch mask in the process. Then, a thicker layer of metal is sputter-deposited on top of the thin metal and $SiO_2$, where it is patterned and plasma-etched to form the yoke 101 attached to the hinges 102 and the mirror address electrodes 108. Note that in this structure the thicker metal yoke 101 is attached to metal post 103 by the much thinner metal torsion hinges 102, so that when electrostatic forces are applied, the thinner hinges tend to twist or torque, thereby tilting the thicker metal yoke.

A second sacrificial layer is then spun-coated onto the exposed yoke and hinge surface of the device and lithographically patterned and hardened, again leaving vias 1005 for additional metal support post, this time in the middle of the yoke 101 to support the mirrors 100. Then the mirror metal is sputter-coated on top of this second sacrificial layer, also filling the support post via 1005 holes. A layer of $SiO_2$ is then plasma-deposited on top of the upper mirror metal surface where it is patterned and plasma-etched to form the individual mirrors 10060 riding on top of the yoke 101, which is attached to the metal posts 103 by the thin torsion hinges 102.

The wafer of DMD chips is then partially sawed 1007 through, leaving the chips barely attached and then a plasma undercut 1008 technique is used to remove the two sacrificial layers from underneath the mirror 100 and yoke/hinge 101/102 structures, leaving the mirror assemblies free to tilt in the positive or negative direction, based on the binary state of the SRAM memory cell over which it is built, when a voltage potential difference is applied. At this point it is desirable to functionally test the wafer of DMDs to determine which devices are worthy of packaging, since packaging represents a large part of the overall cost of the finished product. However, if the mirrors are rotated without being lubricated, many of them will stick, thereby destroying the yield of the wafer. Therefore, at this critical stage of the process, the surfaces of all the devices on the wafer are passivated 1009 using the nebulization method of the present invention, where the nebulizer system including the device slide carrier 410 and deposition chamber 400 are made sufficiently large to accommodate the larger wafer.

The devices on the wafer 1010 are then optically tested ($T_0$ test) by exercising the mirror in the presence of light 1011 and culling out any chips that are non-functional. Next, the wafer is broken into individual chips (DMD devices) 1012 and the chips are die attached into individual packages 1013 and the leads bonded out to pins on the package. A plasma activation process 1014 is then performed on the packaged devices.

Next, another passivation 1015 is applied to the surface of each packaged chip before the window is installed, again using the nebulization method of the present invention. As discussed earlier, great care is taken at this point to uniformly apply the lubricant to the surface of the DMD, while keeping it off the window seal area of the package. The windows are then epoxied to the package to provide a near-hermetically sealed package environment, which will assure a long life part. Finally, the packaged devices go through a burn-in ($T_2$) 1017 and final test ($T_3$) 1018.

While this invention has been described in the context of a preferred embodiment, it will be apparent to those skilled in the art that the present invention may be modified in numerous ways and may assume embodiments other than that specifically set out and described above. Accordingly, it is intended by the appended claims to cover all modifications of the invention that fall within the true spirit and scope of the invention.

The invention claimed is:

1. A method for lubricating a MEMS device, comprising the steps of:

supplying a lubricant to a first input of a nebulizer drift tube;

supplying $N_2$ carrier gas to a second input of said nebulizer drift tube, said gas being mixed with said lubricant to create a mist of small droplets in said drift tube, said mist further expanding in said drift tube;

the drifting of said expanded mist along said drift tube, down through an opening in the bottom of said drift tube, through the small end of an upside down funnel located at the top of a nebulizer passivation chamber;

said mist striking the top convex spherical surface of a turbulation baffle, attached to the wall of said funnel at one or more points so as to leave a gap around the majority of the circumference of said baffle, said mist falling around the edge of said baffle;

supplying $N_2$ turbulator gas through a right angle tube extending through the side of said passivation chamber, through a turbulator nozzle on to the bottom concave side of said baffle, thereby creating an outward turbulence across the concave surface of said baffle and mixing with said mist entering said chamber through the gap around said baffle, thereby filling said chamber with a homogeneous cloud of passivant droplets;

inserting a MEMS device specimen into the device exchanger at the bottom of a nebulizer passivation chamber;

moving and sealing said MEMS device into the exposure aperture of said chamber;

said passivant droplets coming in contact with the surfaces of said MEMS device, thereby uniformly lubricating said surfaces to prevent sticking of moving parts.

2. The method of claim 1 further comprising the step of equalizing the pressure inside and outside said passivation chamber and around the seal-gap between said chamber and said specimen slide holder to reduce the propensity for gas exchange from said chamber and outside atmospheric pressure to zero.

3. The method of claim 1 further comprising the step of maintaining lubricant uniformity by measuring the lubricant mist uniformity in said passivation chamber by passing a red laser beam through the glass walls, across said chamber, measuring said beam's intensity as it exits said chamber, and providing system feedback for controlling system parameters to maintain said mist uniformity.

4. A system for lubricating a MEMS device, comprising:
a lubricant supply hose connected between a lubricant reservoir and a first straight input to a nebulizer drift tube, said input being located at the highest end of said drift tube;
a $N_2$ carrier gas hose connected between a second right angle input to said nebulizer drift tube and the output of a nebulizer $N_2$ gas pressure regulator;
a short coupling hose connected between the lubricant mist output tube located in the center of said drift tube and the small end of an upside down funnel attached as an integral part of a nebulizer passivation chamber, said funnel having a spherical surface turbulator baffle directly below said funnel opening, said baffle being attached to said funnel wall at one or more points leaving a gap around said baffle between the funnel wall and said baffle;
the bottom open end of said nebulizer passivation chamber being sealed to the top surface of the nebulizer system base plate, directly over a specimen exposure aperture, by means of o-ring seals;
a specimen exchange slide built into said base plate to position said specimen in the center of said exposure aperture, the opening around said specimen being sealed from the outside atmosphere;
a hose connected between a second $N_2$ gas regulator and the input of a controllable $N_2$ gas turbulator flow meter;
a $N_2$ gas turbulator hose connected between the output of said turbulator flow meter and a turbulator nozzle protruding through the side of said nebulizer passivation chamber, said nozzle being located perpendicular to and directly below the concave side of said turbulator baffle;
a condensate drain hose connected between an output spout located at the lowest end of said nebulizer drift tube and a lubricant condensate reservoir;
a system hood enclosing said nebulizer containment chamber, drift tube, lubricant reservoir, and condensate reservoir;
a hood pressure gauge mounted through said base plate;
a vacuum hose connected between a vacuum pump and a fitting located in said system base plate and to one side of a controllable exhaust balance flow meter;
the other side of said exhaust balance flow meter connected to the input of a lubricant sieve; and
the output of said lubricant sieve connected through a fitting in the center of said base plate into said nebulizer passivation chamber and to a deposition chamber pressure gauge.

5. The system of claim 4, wherein said lubricant is mixed with said $N_2$ carrier gas at the entrance to said drift tube, creating small droplets of said lubricant.

6. The system of claim 4, wherein
said mixture expands and drifts inside said drift tube allowing lubricant droplets to fall into said passivation chamber funnel opening, striking the convex side of said spherical turbulator baffle;
said turbulation $N_2$ gas being applied to underside concave side of said turbulator baffle, said gas being deflected out to the edges of said baffle;
said lubricant droplets falling through the gap around said baffle, being turbulated by means of said turbulation gas to create a homogeneous cloud of lubricant in bottom portion of said passivation lubrication chamber; and said homogeneous cloud of lubricant coming in contact with said specimen.

7. The system of claim 4, wherein said MEMS specimen can be quickly inserted into said chamber aperture by means of a dual position exchange slide, said slide allowing a current device to be passivated while the previous passivated device is removed and the next device is loaded into said slide.

8. The system of claim 7, wherein the pressure around the seal and around said specimen is maintained at atmospheric pressure inside the chamber to prevent lubricant from escaping and air from entering said chamber through small cracks around said seal, thereby effecting the homogeneity of said lubricant.

9. The system of claim 4, wherein the uniformity of said lubricant is measured by passing a red laser beam through the glass walls, through said passivant cloud, measuring said beam's intensity as it exits said chamber, and providing feedback to control system parameters to maintain mist uniformity.

* * * * *